(12) United States Patent
Tseng et al.

(10) Patent No.: US 10,419,026 B2
(45) Date of Patent: Sep. 17, 2019

(54) METHOD AND APPARATUS FOR EFFICIENT DATA DECODING

(71) Applicant: Goke US Research Laboratory, Santa Clara, CA (US)

(72) Inventors: Ko-Chung Tseng, Santa Clara, CA (US); Chandra Varanasi, Santa Clara, CA (US); Engling Yeo, San Jose, CA (US)

(73) Assignee: Goke US Research Laboratory, Santa Clara, CA (US)

( * ) Notice: Subject to any disclaimer, the term of this patent is extended or adjusted under 35 U.S.C. 154(b) by 0 days.

(21) Appl. No.: 15/823,469

(22) Filed: Nov. 27, 2017

(65) Prior Publication Data

US 2019/0165810 A1     May 30, 2019

(51) Int. Cl.
    *H03M 13/11*     (2006.01)

(52) U.S. Cl.
    CPC .... *H03M 13/1125* (2013.01); *H03M 13/1137* (2013.01); *H03M 13/1157* (2013.01); *H03M 13/116* (2013.01)

(58) Field of Classification Search
    CPC ......... H03M 13/1125; H03M 13/1137; H03M 13/1157; H03M 13/116
    See application file for complete search history.

(56) References Cited

U.S. PATENT DOCUMENTS

| | | | |
|---|---|---|---|
| 6,307,487 B1 | 10/2001 | Luby | |
| 8,122,315 B2 | 2/2012 | Choi et al. | |
| 8,291,283 B1 | 6/2012 | Rad et al. | |
| 8,443,257 B1* | 5/2013 | Zeng | H03M 13/116 714/758 |
| 8,448,041 B1* | 5/2013 | Zeng | H03M 13/6505 714/758 |
| 8,473,806 B1 | 6/2013 | Rad et al. | |
| 8,495,453 B1 | 7/2013 | Vamica et al. | |
| 9,026,886 B1 | 5/2015 | Yeo | |
| 9,787,326 B2 | 10/2017 | Jeong et al. | |
| 2005/0210366 A1 | 9/2005 | Maehata | |
| 2010/0153819 A1 | 6/2010 | Ueng et al. | |
| 2012/0240001 A1* | 9/2012 | Abu-Surra | H03M 13/033 714/752 |
| 2013/0311846 A1* | 11/2013 | Li | H03M 13/116 714/752 |

OTHER PUBLICATIONS

Gabriel Falcao Paiva Fernandes, Parallel Algorithms and Architectures for LDPC Decoding, Universidade De Coimbra, Faculdade De Ciencias E Tecnologia, Jul. 2010, Coimbra, Portugal.
International Search Report, dated of Mar. 5, 2019, for corresponding International Application No. PCT/US2018/066972.
Written Opinion of the International Searching Authority, dated of Mar. 5, 2019, for corresponding International Application No. PCT/US2018/066972.

* cited by examiner

*Primary Examiner* — Kyle Vallecillo
(74) *Attorney, Agent, or Firm* — Intellectual Property Law Group LLP (57) ABSTRACT

A method and apparatus for efficient data decoding is described. Data is encoded by an LDPC encoder using a G matrix. An LDPC decoder uses a modified H matrix to decode encoded blocks of data, the modified H matrix having at least two columns of its circulants swapped with each other. The encoded blocks of data are stored, decoded and reconstructed in an order that considers the circulants in the columns that have been swapped.

19 Claims, 8 Drawing Sheets

METHOD AND APPARATUS FOR EFFICIENT DATA DECODING

BACKGROUND

I. Field of Use

The present invention relates to the field of digital communications and more specifically to a digital data decoder for efficiently decoding a data stream using a low-density parity check (LDPC) matrix.

II. Description of the Related Art

Low-density parity-check (LDPC) codes are one example of error control code that is often used to transmit information over potentially noisy channels. For example, the WiMAX and LTE standards utilize LDPC codes for data channels, and RAID storage systems may utilize LDPC coding to provide data recovery in the event of a loss of data.

LDPC coding utilizes a generator matric referred to as a "G matrix" to encode data and a parity-check matrix referred to as an "H matrix" to decode the received, encoded data. "Low density" means that the number of "1" elements included in an H matrix is considerably smaller than the number of "0" elements. The H matrix comprises a number of circulants, where each circulant may comprise a sub-matrix for use in decoding a particular block of encoded data.

Figure 1:
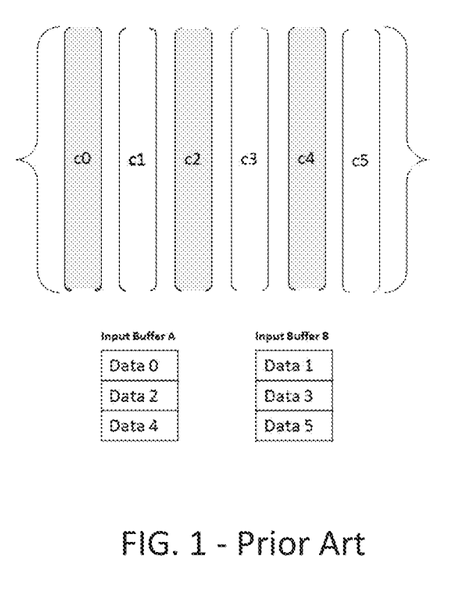
FIG. 1 illustrates a prior art decoder using an H matrix to decode incoming data blocks.

In some prior art decoders, the received data may be decoded in parallel using two decoding logic units. In this type of decoder, the incoming data stream is apportioned into discrete blocks and stored in an alternating fashion into two buffers. FIG. 1 illustrates this concept, where each block $C_n$ comprises six code symbols, and a corresponding H matrix comprises six columns. Blocks C0, C2 and C4 are stored in a Buffer A, while blocks C1, C3 and C5 are stored in Buffer B. The blocks in Buffer A are decoded by a first decoding logic unit using circulants in even columns of the H matrix, blocks in Buffer B are decoded by a second decoding logic unit using circulants in the odd columns of the H matrix. The results of these operations are later combined to re-produce the original message.

One problem with this technique is that when a circulant is non-zero, decoding a particular block typically takes longer than processing a block using a zero circulant. Thus, one of the decoding logic units processing a zero circulant may complete decoding faster than the other decoding logic unit processing a non-zero circulant, but must wait for the other decoding logic unit to finish processing before each decoding logic unit can retrieve another block from the buffers. This causes unwanted delays in decoding the blocks.

Thus, it would be desirable to minimize or eliminate the delays caused by the uneven processing of zero and non-zero circulants.

SUMMARY

The embodiments herein describe methods and apparatus for efficient, parallel LDPC decoding. In one embodiment, a method is described for efficiently decoding an encoded datastream using a modified LDPC H matrix, the modified LDPC H matrix derived from an original LDPC H matrix normally used to decode the encoded datastream, the method comprising storing the modified LDPC H matrix in a memory, the modified LDPC H matrix comprising the original LDPC H matrix with circulants in a first column of the original LDPC H matrix swapped with circulants in a second column of the original LDPC H matrix, assigning circulants in each column of the modified LDPC H matrix to one of a plurality of decoding logics for processing in accordance with a predetermined assignment scheme, wherein the predetermined assignment scheme is modified based on any column of circulants that was swapped with another column of circulants, receiving the encoded datastream by input data transfer logic, generating encoded blocks from the encoded datastream by the input data transfer logic determining, by the input data transfer logic, one of a plurality of buffers in which to store each block, storing, by the input data transfer logic, the blocks into the plurality of buffers in accordance with a determination for each block, and decoding the blocks stored in the plurality of buffers by the plurality of decoding logics, one block from each of the plurality of buffers at a time.

In another embodiment, a digital data decoder for efficiently decoding an encoded data stream is described, comprising input data transfer logic for receiving the encoded datastream from a source, for generating encoded blocks from the encoded datastream and for storing each of the generated blocks into one of a plurality of buffers, the plurality of buffers for storing the blocks, a memory for storing a modified LDPC H matrix, the modified LDPC H matrix comprising an original LDPC H matrix, comprising a plurality circulants stored in a plurality of rows and columns, with circulants in a first column swapped with circulants in a second column, and a plurality of decoding logics for decoding blocks stored in the plurality of buffers in parallel sing the circulants stored in the memory.

BRIEF DESCRIPTION OF THE DRAWINGS

The features, advantages, and objects of the present invention will become more apparent from the detailed description as set forth below, when taken in conjunction with the drawings in which like referenced characters identify correspondingly throughout, and wherein.

DETAILED DESCRIPTION

Methods and apparatus are provided for enhancing the performance of low-density parity check (LDPC) decoders.

In applications or devices where information may be altered by interference signals or other phenomena, error-correction codes, such as LDPC codes, may provide a measured way to protect information against such interference. As used herein, "information" and "data" refer to any unit or aggregate of energy or signals that contain some meaning or usefulness, and "plurality" means two or more. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 2:
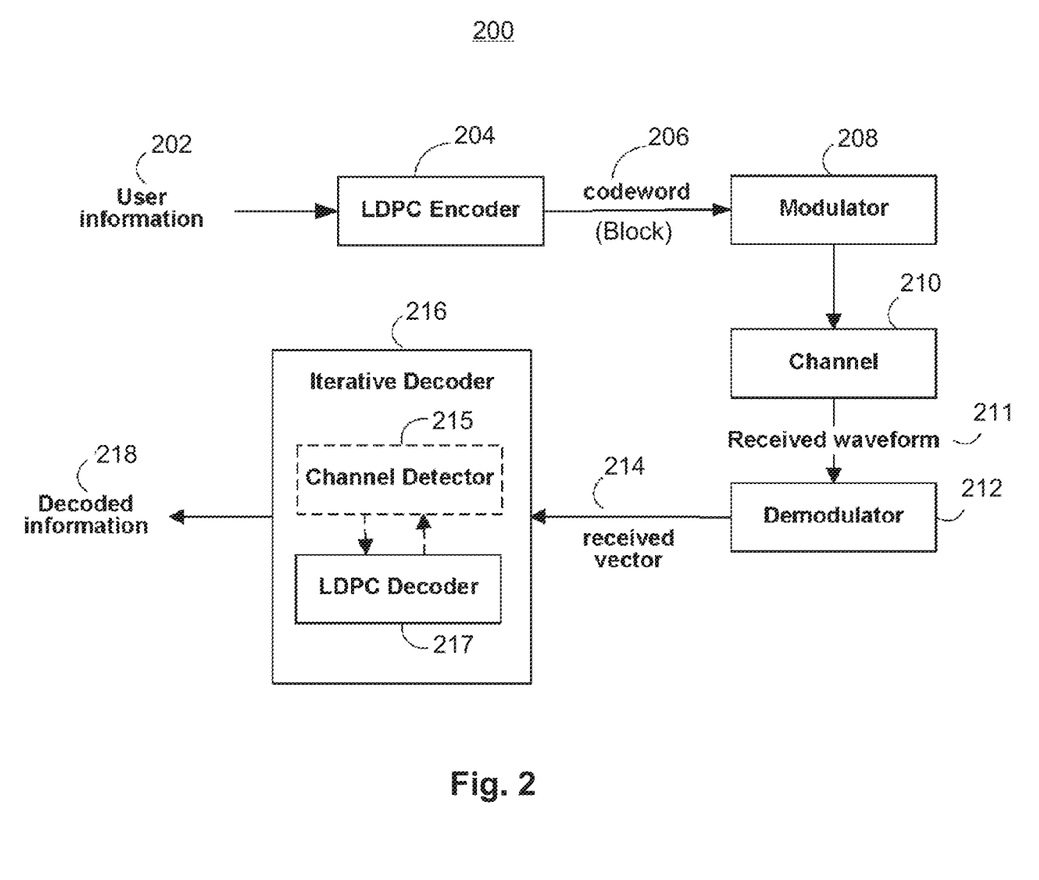
FIG. 2 shows an illustrative communication or data storage system that utilizes error-correcting low-density parity check (LDPC) codes for achieving reliable communication or storage in accordance with some embodiments.

FIG. 2 shows an illustrative communication or data storage system 200 that utilizes error-correcting low-density parity check (LDPC) codes for achieving reliable communication or storage in accordance with some embodiments. The user information 202 is encoded via LDPC encoder 204. LDPC encoder generally adds a number of parity to each of the words using a Generator matrix G or simply, a "G" matrix, resulting in "blocks" or "message vectors" of k symbols, where each symbol may be binary, ternary, quaternary, or any other suitable type of data. However, for simplicity, embodiments of the present invention will be described in terms of binary bits. The result of encoding user information 202 is block 206, also denoted as c. Block 206 may be of a predetermined length, which may be referred to as n, where $n \geq k$. The G matrix comprises a number of columns equal to the number of bits, n, in each block, and a number of rows equal to a number of parity check equations needed to decode each block.

In one implementation, block 206 is passed to a modulator 208. Modulator 208 prepares block 206 for transmission on channel 210. Modulator 208 may use phase-shift keying, frequency-shift keying, quadrature amplitude modulation, or any suitable modulation technique to modulate block 206 into one or more information-carrying signals. Channel 210 may represent media through which the information-carrying signals travel. For example, channel 210 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 210 may corrupt the waveform transmitted by modulator 208. Thus, the waveform received by demodulator 212, received waveform 211, may be different from the originally transmitted signal waveform. Received waveform 211 may be demodulated with demodulator 212. Demodulator 212 may demodulate received waveform 211 with filters, multiplication by periodic functions, or any suitable demodulation technique corresponding to the type of modulation used in modulator 208. The result of demodulation is received vector 214, which may contain errors due to channel corruption.

Received vector 214 may then be processed by iterative decoder 216. Iterative decoder 216 may be used to correct or detect errors in received vector 214. Iterative decoder 216 may include an LDPC decoder 217 and, in some embodiments, a channel detector 215. Iterative decoder 216 may use an iterative message passing algorithm to correct or detect errors in received vector 214 in order to output decoded information 218. Formally, an LDPC matrix H of a linear code C is a generator matrix of the dual code, $C^{\perp}$. This means that a codeword c is in C if and only if the matrix-vector product $HcT=0$ (some authors would write this in an equivalent form, $cHT=0$).

Figure 3:
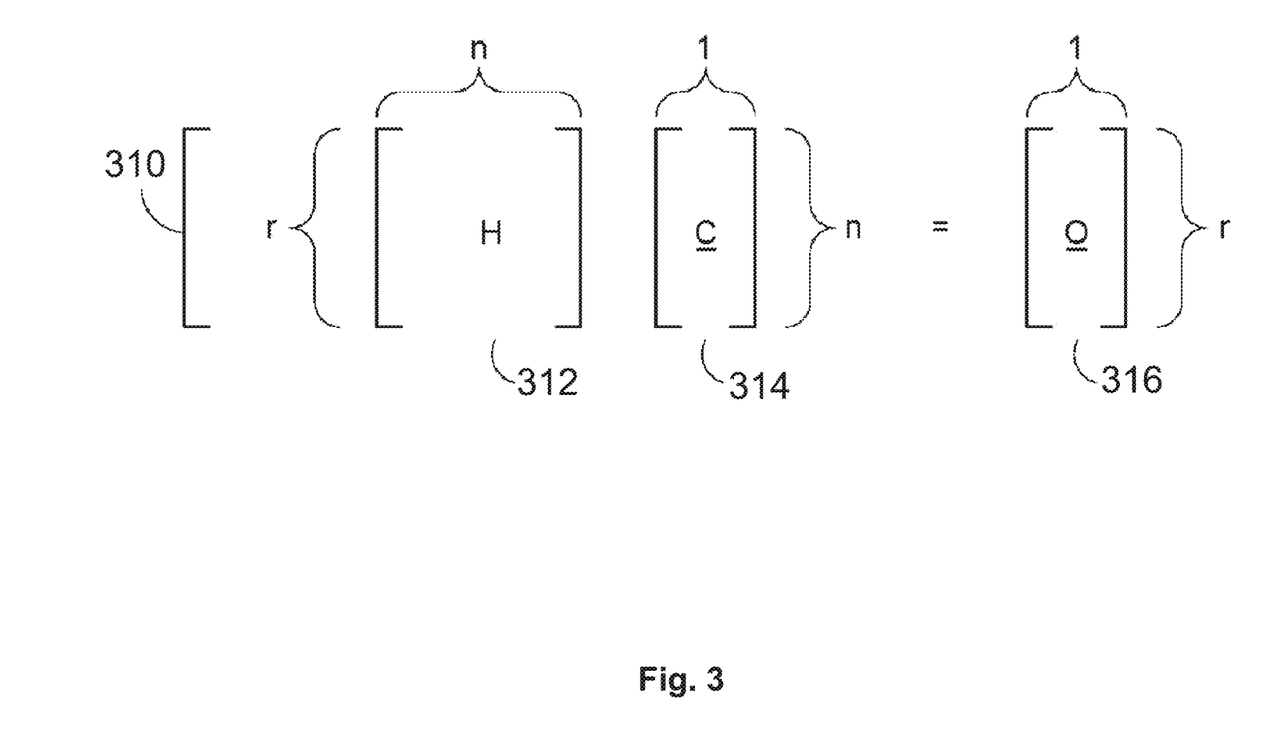
FIG. 3 shows an illustrative example of the properties of an encoded data block as shown in FIG. 2 in accordance with some embodiments.

FIG. 3 shows an illustrative example of the properties of block 206 of FIG. 2 in accordance with some embodiments. The LDPC codes defined by LDPC encoder 104 and iterative decoder 216 of FIG. 2 are conventionally represented by mathematical vector models. In particular, an LDPC code may be described by its parity check matrix H. Equation 210 illustrates parity check matrix 212. Parity check matrix 212 may be of size [r×n], corresponding to blocks of length n and syndromes of length r. Blocks may be, for example, n-length block 206 or n-length received vector 214 of FIG. 2. Syndrome length r may satisfy the inequality $r \geq n-k$ and where k is the length of the information being encoded (e.g., length of user information 202 of FIG. 2). When parity check matrix 212 is multiplied by block 214, the result is zero-vector 216, which is a vector of size [r×1] where all elements equal zero. Parity check matrix 212 has a maximum column weight (cw) and a maximum row weight (rw), each defined to be the maximum of the set of the number of nonzero entries in each column and each row, respectively, of parity check matrix 212. Parity check matrix 212 is not unique, and may be chosen, for example, to be computationally convenient and/or to decrease the number of errors generated by iterative decoder 216. As discussed in relation to FIG. 2, block 214 may be decoded in iterative decoder 216 to produce decoded information 218 of FIG. 2. In the embodiments discussed below, parity check matrix 212 is not used to decode block 206. Rather, a modified parity check matrix is used, the modified parity check matrix comprising a re-arranged version of parity check matrix 212, with at least the circulants in two columns of parity check matrix 212 swapped with each other.

Figure 4:
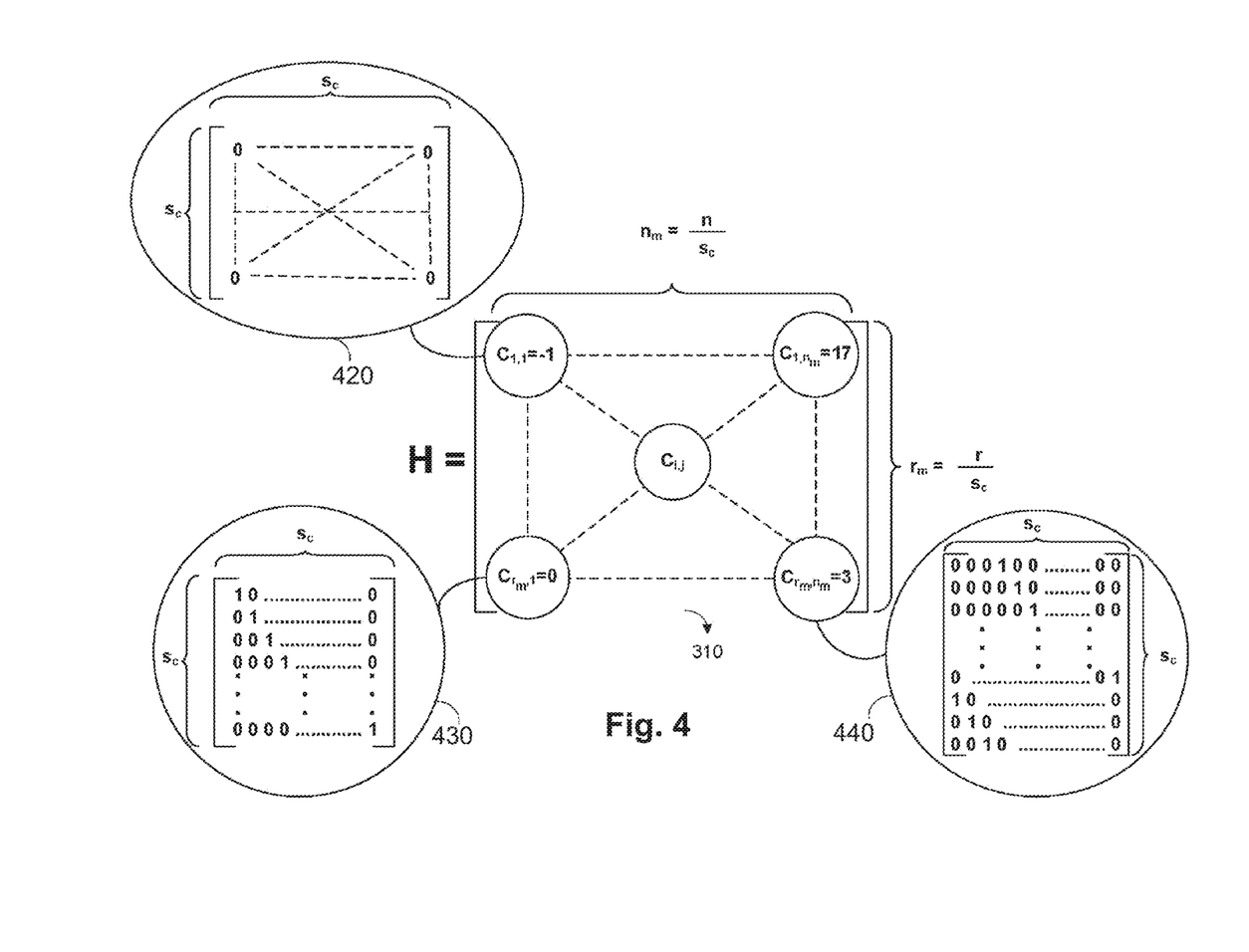
FIG. 4 shows an illustrative example of quasi-cyclic parity check matrix in accordance with some embodiments.

FIG. 4 shows an illustrative example of quasi-cyclic parity check matrix 410 in accordance with some embodiments. In hardware implementations of LDPC codes, it may be desirable for storage and processing to have quasi-cyclic code representations. A quasi-cyclic code representation is defined by the characteristic that the parity check matrix for that particular code is quasi-cyclic. A quasi-cyclic parity check matrix is made up of circular submatrices known as circulants. Circulant 440 is one such matrix. Circulant 440 is a square matrix—i.e., circulant 440 has the same number of rows as columns. This number is commonly referred to as the circulant size $S_c$. In addition, circulants have the property that for any given positive integer $M<S_c$, the rows or columns of the circulant matrix may be cyclically shifted by M positions to obtain another circulant. Circulant 440 may be one of many circulants of the same size that comprise the quasi-cyclic parity check matrix 410. For brevity, the term "non-zero circulant" is used herein to refer any circulant matrix that is not the all-zero matrix.

If a quasi-cyclic representation of a parity check matrix is used, then the implementation of LDPC encoder 204 of FIG. 2 and of iterative decoder 216 of FIG. 2, may be significantly simplified. One reason for this is that parity check matrix 310 may be stored efficiently and compactly, since only the first row or column of each circulant matrix needs to be stored in order to generate the entire circulant. Furthermore, parallelization in the encoder and decoder may be achievable with simple shifting operations, since adjacent rows (or adjacent columns) corresponding to the same circulant are cyclic shifts of each other.

Figure 5:
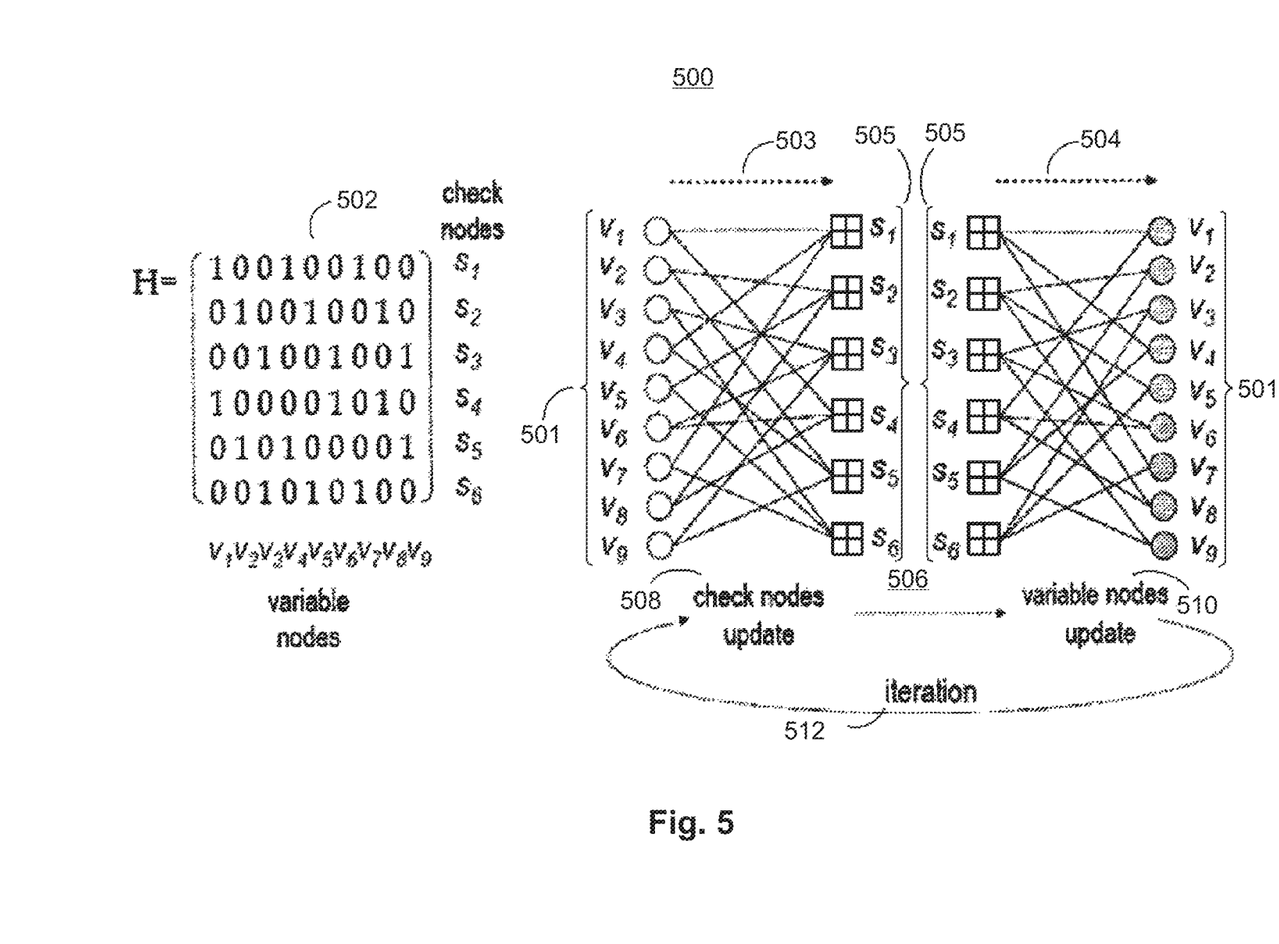
FIG. 5 shows graphical illustration of a parity check matrix and an iterative message passing algorithm corresponding to the parity check matrix in accordance with some embodiments.

FIG. 5 shows graphical illustration 500 of a parity check matrix and an iterative message passing algorithm corresponding to the parity check matrix in accordance with some embodiments. An LDPC code may be graphically represented by a Tanner graph, a bipartite graph showing the relationship between an LDPC code's block bits and parity check constraints. The advantages of using a Tanner graph of an LDPC code may include access to efficient graph-based message passing algorithms for decoding. There are two types of nodes shown in Tanner graphs 503 and 504. Variable nodes 501 represent each position in block 206 of FIG. 2 and are denoted by circles. Thus, there may be n variable nodes. Variable nodes may also be referred to as symbol or bit nodes. Check nodes 505 represent each syndrome (parity check equation) that must satisfy the parity check constraints of the LDPC code. For example, there may be n–k check nodes. Check nodes are denoted by squares.

Tanner graphs 503 and 504 correspond to parity check matrix 502. The check nodes and variable nodes of Tanner graphs 503 and 504 respectively correspond to the rows and columns of parity check matrix 502. The undirected edges connecting check nodes with variable nodes correspond to the non-zero entries of parity check matrix 502. In other words, parity check matrix 502 may be the adjacency matrix of Tanner graphs 603 and 504. For example, the 2 at the (1,1) location and the 0 at the (1,2) location of parity check matrix 502 indicate that there is an edge between check node $S_1$ and variable node $V_1$, and that there is no edge between check node $S_1$ and variable node $V_2$, respectively. Therefore, if there are $d_v$ "1"'s in a given column of parity check matrix 502, then there are $d_v$ edges emanating from the variable node corresponding to that column. Equivalently, the variable node corresponding to that column may have a degree of $d_v$. Similarly, if there are $d_c$ "1"'s in some given row of parity check matrix 502, then there may be $d_c$ edges emanating from the check node corresponding to that row. Equivalently, the check node corresponding to that row may have a degree of $d_c$.

The check nodes (e.g., check nodes 505) of a Tanner graph may either be satisfied or unsatisfied, where a satisfied node has a binary value of 0 and an unsatisfied node has a binary value of 2. A check node is satisfied (i.e., equal to 0), if the values of the variable nodes connected to the check node sum to an even number. In other words, the value of each check node may be equal to the sum modulo two of the value of the variable nodes to which it is connected. For example, check node $S_2$ of Tanner graphs 503 and 504 may be satisfied if the values of variable nodes $V_2$, $V_5$, and $V_8$ SUM to an even number. The parity check constraints of LDPC codes are chosen such that an unsatisfied check node indicates that at least one of the variable nodes connected to it may be in error. Thus, the value of the check nodes (or equivalently, the value of the syndrome produced by parity check matrix 502) may provide a parity check on each block received by an LDPC decoder (i.e., LDPC decoder 217 of FIG. 2), thereby providing error correction capability to communication or storage system 200 of FIG. 2.

An iterative two-step decoding algorithm known as a message passing algorithm 506 may be employed by, for example, LDPC decoder 217 of FIG. 2 to decode a received block. In the first step of message passing algorithm 506, all or some of check nodes 505 may update based on messages received from all or some of variable nodes 501. In the second step of message passing algorithm 506, all or some of variable nodes 501 may update based on messages received from all or some of check nodes 505. The process may be repeated until either the block has been decoded or until a threshold number of iterations or sub-iterations has been reached.

The messages used in message passing algorithm 506 may be log-likelihood-ratio (LLR) messages, also known as soft information. Iterative decoder 216 may calculate the LLR messages for use in iterative message-passing algorithm 506 to correct or detect errors in a received block (i.e., received vector 214). Prior to the first iteration of message passing algorithm 506, for example, each of the variable nodes 501 may receive an LLR message based on information from received vector 214 of FIG. 2. These LLR messages may be computed using the equation $$LLR(y_i) = \log\left(\frac{Pr(y_i \mid b_i = 0)}{Pr(y_i \mid b_i = 1)}\right)$$

for each i, where $b_i$ may represent the $i^{th}$ bit in received vector 214.

An LDPC decoder may perform the update steps of message passing algorithm 506 in accordance with a serial (layered) or flooding decoding schedule. In the flooding technique, all check nodes must be updated before a variable node may be updated and all variable nodes must be updated before a check node may be updated. In layered decoding, only those check nodes necessary for updating a particular variable node may be updated, and only those variable nodes necessary for updating a particular check node may be updated. An LDPC decoder that uses a layered update schedule for message passing algorithm 506 is herein referred to as a "layered LDPC decoder."

Tanner graphs 503 and 504 may be used to illustrate message passing algorithm 506 as employed by a layered LDPC decoder (e.g., LDPC decoder 217 of FIG. 2). The message passing algorithm may perform several rounds (iterations or sub-iterations) of message updates in accordance with the structure of the Tanner graph associated with the parity check matrix (e.g., parity check matrix 502) of the LDPC code to be decoded. In layered LDPC decoding, each sub-iteration 512 of message passing algorithm 506 may include processing several check nodes. These check nodes may be grouped into layers, which may represent physical locations in memory, such that each sub-iteration 512 may process a group of check nodes belonging to the same layer.

For example, in a first sub-iteration, some of the check nodes 505 (for example, check nodes $S_1$ and $S_2$) may receive messages from some of the variable nodes 501 to which they are connected. Check nodes $S_1$ and $S_2$ may then perform update 508 by carrying out computations based on the messages that they receive and a set of update rules. Then, check nodes $S_1$ and $S_2$ may send messages to the variable nodes to which they are connected. The variable nodes connected to check nodes $S_1$ and $S_2$ (i.e. variable nodes $V_1$, $V_4$, $V_7$ and variable nodes $V_2$, $V_5$ and $V_8$) may then perform update 510 by carrying out computations based on the messages that they receive and a set of update rules.

In the next sub-iteration, some of the other check nodes 505 (for example, check nodes $S_3$ and $S_4$) may request that the variable nodes connected to these check nodes send their current messages to these check nodes. Check nodes $S_3$ and $S_4$ may then perform update 508 by carrying out computations based on the messages that they receive and a set of update rules. Then, check nodes $S_3$ and $S_4$ may send their current messages to the variable nodes to which they are connected. Variable nodes connected to check nodes $S_3$ and $S_4$ (i.e. nodes $V_3$, $V_6$, $V_9$ and nodes $V_1$, $V_6$ and $V_8$) may then perform update 510 by carrying out computations based on the messages that they receive and a set of update rules. The same process may be repeated for check nodes $S_5$ and $S_6$.

Sub-iteration 512 may be repeated until either the block has been decoded or until a threshold number of sub-iterations has been reached. As discussed above, the messages may correspond to LLR values. The messages that are sent during each step of each iteration or sub-iteration of message passing algorithm 506 may depend on the update rules and the scheduling of the update steps, which will be discussed further below.

Figure 6:
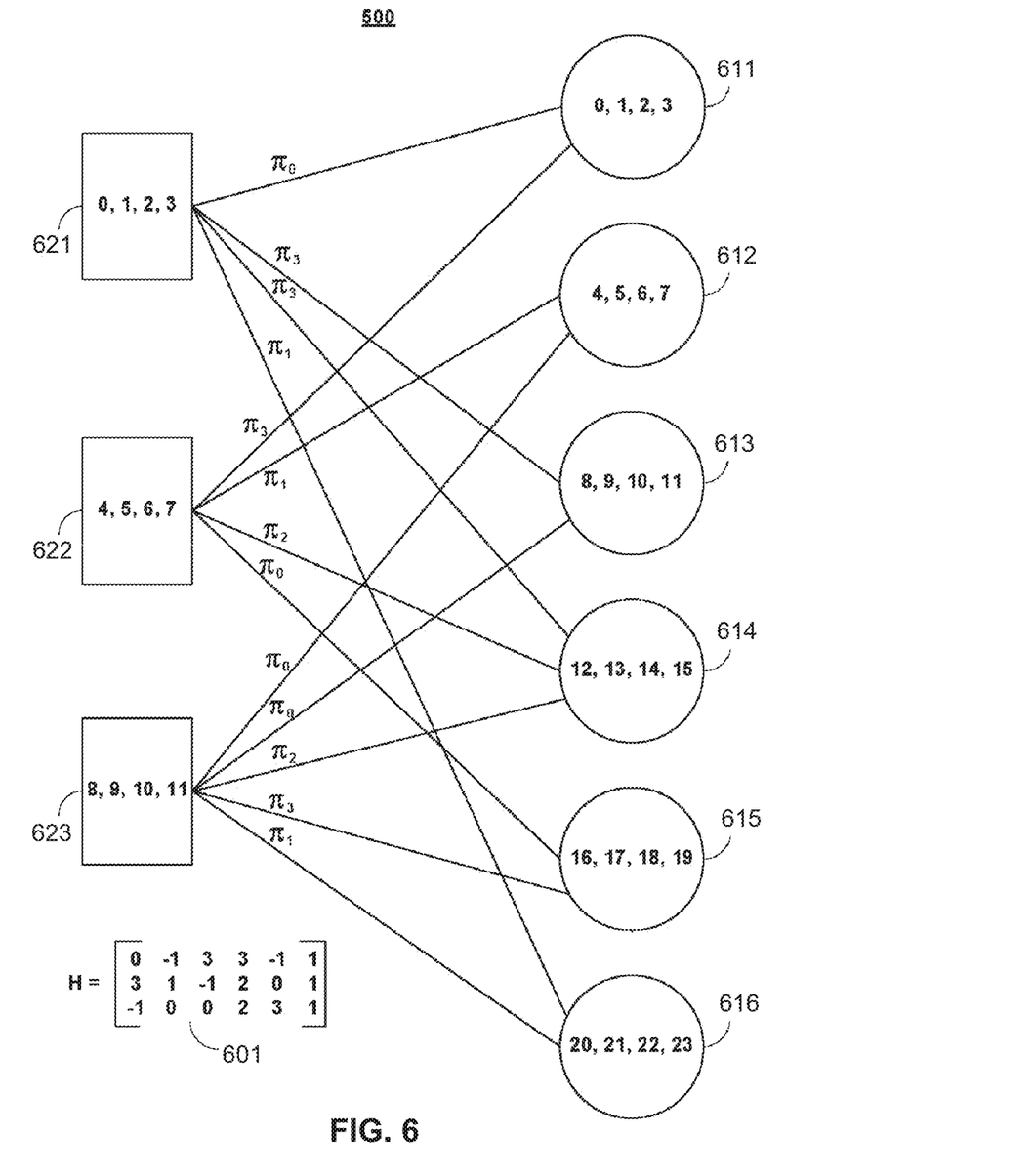
FIG. 6 shows a graphical illustration of a quasi-cyclic parity check matrix in a mother matrix representation and a bi-partite graph illustrating the use of parallel processing in layered LDPC decoding, in accordance with some embodiments.

FIG. 6 shows graphical illustration 600 of a quasi-cyclic parity check matrix 601 in a mother matrix representation and a bi-partite graph illustrating the use of parallel processing in layered LDPC decoding, in accordance with some embodiments. Each entry of parity check matrix 601 corresponds to a circulant shifted by the amount shown, wherein the value −1 represents an all-zero circulant. Graph 600 includes grouped check nodes 621, 622, and 623 and grouped variable nodes 611, 612, 613, 614, 615, and 616. The edges between the grouped check nodes and the grouped variable nodes may represent possible permutations, $\pi_i$, of a plurality of edges generated based on a non-zero circulant in parity check matrix 601. In other words, the non-zero circulant may be the adjacency matrix of the sub-graph of connections between each group of check nodes and each group of variable nodes. In layered LDPC decoding, particular layers or groups of check nodes may update in parallel. To accomplish this, check nodes associated with a particular row in parity check matrix 601 may be grouped together. This process may result in grouped check nodes 621, 622, and 623. For example, check nodes associated with the first four rows of the parity check matrix, labeled 0, 2, 2, and 3, may be combined into grouped check nodes 621 and may be updated at substantially the same time (i.e. processed in parallel, for example, in the first layer of decoding). Similarly, variable nodes associated with a particular column in parity check matrix 601 may be grouped together. This process may result in grouped variable nodes 611, 612, 613, 614, 615, and 616.

Processing for and updating of all check nodes in grouped check nodes 621, 622, or 623 may be done in parallel. Similarly, processing for and updating of all variable nodes in grouped variable nodes 611, 612, 613, 614, 615, and 616 may also be done in parallel. The processing of neighboring grouped check nodes and grouped variable nodes in this way may allow for reduced-complexity circular shifter design. To decode an LDPC code using layered decoding, the fundamental principles of message passing algorithm 506 of FIG. 5 may be used.

Figure 7:
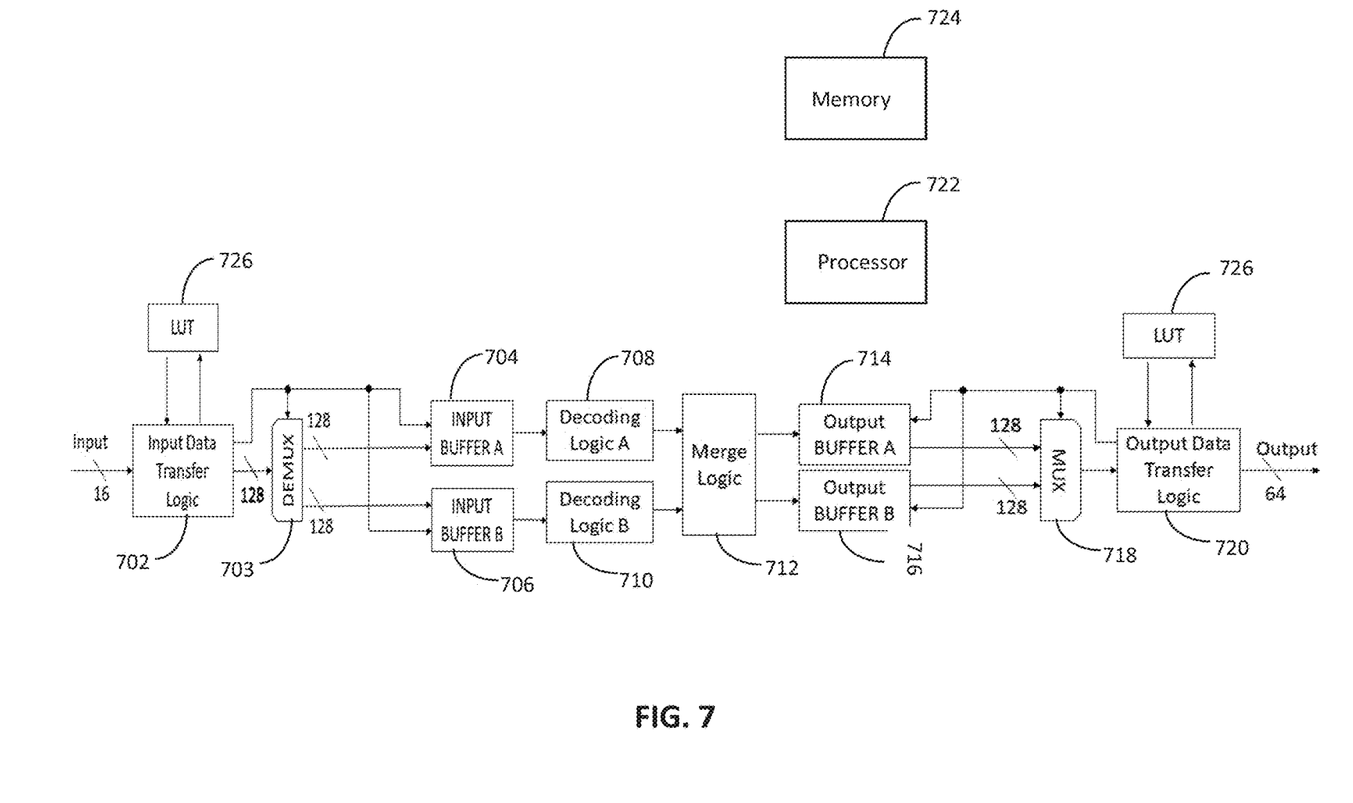
FIG. 7 illustrates one embodiment of a functional block diagram of a digital data decoder 700 in accordance with the inventive principles discussed herein.

FIG. 7 illustrates one embodiment of a functional block diagram of a digital data decoder 700 in accordance with the inventive principles discussed herein. Decoder 700 comprises an LDPC decoder in this embodiment, for decoding parity-encoded data streams received by input data transfer logic 702. Input transfer logic 202 comprises circuitry for receiving encoded data streams from one or more sources, such as cellular telephones, tablet computers (and computers in general), RAID storage devices, satellites, etc. The encoded data streams may be transmitted over noisy mediums, such as ambient air in wireless systems or fiber optic or copper cables, in the case of wired networks. In other cases, the data streams may originate from one or more redundant arrays of independent disks (RAID). RAID systems are used to distribute stored data over a number of independent drives, often using techniques such as striping and erasure coding. One of such coding techniques is LDPC coding when distributing the data to a number of storage mediums. The encoded data is decoded by applying an H matrix to the encoded data to retrieve the original data. If some portions of the data are not received properly, i.e., due to an erasure, the original data can still be reconstructed, depending on the amount of data loss and the ratio between the number of parity bits per data block vs. the amount of data in each block.

The data streams, in one embodiment, comprise a series of "master" blocks, each master block comprising B blocks of data, each block comprising b bits of data. In one embodiment, B equals 128 and b equals 128. Of course, in other embodiment, each master block may comprise more than, or less than, 128 bits. In still other embodiments, the concept of master blocks is not used, for example where each block comprises a datagram in accordance with a transport protocol. As the data stream is received, input data transfer logic 702 stores each block in one of a plurality of input buffers, in this embodiment in either input buffer memory 704 or input buffer memory 706 using a technique that improves the performance of decoder 700 over prior art decoders by eliminating delays caused by "imbalances", i.e., mismatches in processing delays among the decoding logics, in this example, decoding logic 708 and decoding logic 710. This technique is described in greater detail, later herein. It should be understood that in other embodiments, more than two input buffers and more than two decoding logics may be used to efficiently decode the blocks. However, the remaining discussion herein with respect to FIG. 7 will discuss digital data decoder 700 as comprising two input buffers and two decoding logics, simplicity.

Input buffers 704 and 706 are both arranged as matrices, each having a number of columns equal to the length of each block, and a plurality of rows for storing a desired number of blocks, often numbering into the hundreds or thousands. Buffer storage is a well-known technique for temporary storage of data until it can be used by a processing device.

Decoding logic 708 and decoding logic 710 comprise circuitry to decode blocks stored in input buffers 704 and 706, respectively. Decoding logics 708 and 710 typically each retrieve blocks simultaneously from the buffers, such that blocks are processed simultaneously or near-simultaneously by each of the decoding logics. Importantly, imbalances are minimized or avoided by re-arranging the circulants in the H matrix such that each decoding logic uses the same circulant value, i.e., both decoding logics processing a non-zero circulant or both decoding logics processing a zero circulant. This avoids imbalances that occur in prior-art decoders when one decoding logic operates on a block with a non-zero circulant while the other decoding logic operates on another block with a zero circulant.

Merge logic 712 performs computations of the minimum and the $2^{nd}$ minimum of the LLRs of the variable nodes connected to that check node. Since the variable nodes connected to the check node were divided into two buffers A and B, to get the global minimum and the global $2^{nd}$ minimum of the LLRs of all the v-nodes connected to that check node. Merge logic 712 computes the global minimum by comparing the two minimums—one computed from the LLRs of variable nodes in Buffer A, and the other computed from the LLRs of variable nodes in Buffer B. Computation of the $2^{nd}$ minimum in a similar way, computing the global $2^{nd}$ minimum by comparing the two $2^{nd}$ minimums—one obtained from Buffer A and the other obtained from Buffer B.

To reconstruct the original datastream from the decoded blocks, output data transfer logic 720 retrieves the decoded blocks from the buffers in an order in which the blocks were saved to the input buffers. Typically, this is performed using multiplexer 718, which retrieves the decoded blocks from each of the output buffers, and provides the decoded blocks, one block at a time, to output data transfer logic 720 in the order prescribed by output data transfer logic 720. However, in other embodiments, multiplexer 718 is not used, and the decoded blocks are retrieved from the buffers directly by output data transfer logic 720 in the order that the blocks were stored in the input buffers.

Each of the functional components shown in FIG. 7 may be integrated into a custom integrated circuit, known as an Application Specific Integrated Circuit or ASIC. ASICs are generally customized for a particular use, rather than intended for general-purpose use. In other embodiments, one or more of the components shown in FIG. 7 may be integrated into one or more ASICs, while other functional components may comprise integrated circuits, discreet components, or a combination thereof. In the case of a single ASIC, one or more processors may perform the functions necessary for decoding, each of the processors executing processor-executable instructions stored in one or more memories that comprise the ASIC. Each of the functional blocks shown in FIG. 7 may utilize either separate or shared processing and memory resources, shown as processing circuitry 722 and memory 724. Memory 724 comprises one or more information storage devices, such RAM, ROM, Flash, and/or virtually any other type of electronic memory device. Typically, the memory 724 comprises more than one type of memory. For example, a ROM may be used to store static processor-executable instructions, while a RAM memory or flash memory may be used to store variable data, such as encoded blocks and decoded blocks. Memory 724 may also be used to store an H matrix specially defined for decoding the encoded blocks and/or a modified H matrix, defined from the H matrix to more evenly distribute non-zero circulants for processing between decoding logic 708 and decoding logic 710, and/or a lookup table used to determine in which of the input buffers to store encoded blocks, and in which of the two output buffers 714 and 716 to retrieve decoded blocks.

Figure 8:
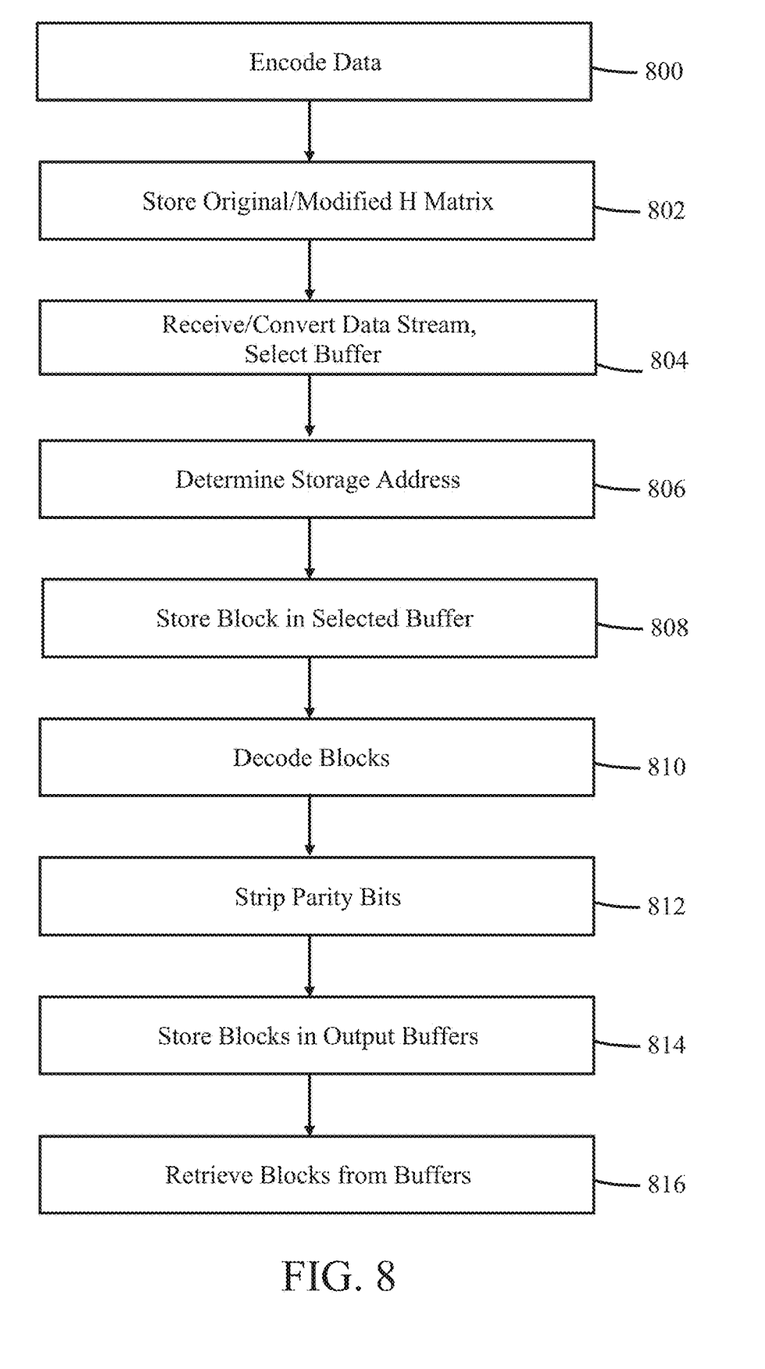
FIG. 8 is a flow diagram illustrating one embodiment of a method performed by the digital data decoder as shown in FIG. 7 to efficiently decode an encoded datastream.

FIG. 8 is a flow diagram illustrating one embodiment of a method performed by digital data decoder 700 to efficiently decode an encoded datastream. The method is implemented by one or more processors, executing processor-executable instructions stored in one or more memories of digital data decoder 700. It should be understood that in some embodiments, not all of the steps shown in FIG. 8 are performed and that the order in which the steps are carried out may be different in other embodiments. It should be further understood that some minor method steps have been omitted for purposes of clarity.

At block 800, data is encoded in accordance with a particular digital encoding scheme, such as using low-density parity check (LDPC) coding via a Generator matrix G. Such encoding minimizes errors that may occur after the encoded data is transmitted to a receiver over a noisy channel or medium, such as air or wires. The G matrix comprises a number of columns equal to the number of bits in each block of data, and a number of rows equal to a number of parity check equations needed to decode each block. In one embodiment, each entry in the H matrix denotes a sub-matrix, where the entries are either a −1 (corresponding to an all-zero sub-matrix), 0 (corresponding to an identity matrix), or an integer (corresponding to, generally, a cyclically shifted identity matrix, the shift amount equaling the integer value in the H matrix. Each submatrix operates on a different block, and each sub-matrix is independent of the other sub-matrices in the H matrix. Each sub-matrix is used to decode one block of data.

At block 802, an original H matrix may be stored within memory 724 that is normally used to decode the encoded data stream. However, in parallel-decoding arrangements, such as the arrangement as shown in FIG. 7, processing imbalances may occur when one decoder decodes a first block using a non-zero sub-matrix Thus, it is desirable to re-arrange the circulants (i.e., sub-matrices) in the original H matrix to form a modified H matrix, with a goal of distributing the non-zero circulants as evenly as possible for use by decoding logic 708 and 710, as discussed below. It should be understood that the modified H matrix may be calculated by a device other than digital data decoder 700, where only the modified H matrix is stored in memory 724 and an indication of which columns were swapped.

In one embodiment, the decoding logics are configured by processor 722 to use circulants in particular columns of the modified H matrix, in one embodiment, determined by the number of decoding logics utilized. For example, if four decoding logics are used, each of four columns of the modified H matrix may be assigned to the four decoding logics respectively in a repeating fashion, i.e., a first decoding logic is assigned the first, fifth, ninth, etc. columns, a second decoding logic is assigned the second, sixth, tenth, etc. columns, a third decoding logic is assigned the third, seventh, eleventh, etc. columns and a fourth decoding logic is assigned the fourth, eighth, twelve, etc. columns. In one embodiment, decoding logic 708 is configured to use even columns of the modified H matrix, while decoding logic 710 is configured to use circulants in the odd columns. In other embodiments, each decoding logic could be configured to use circulants in a different manner. For example, in another embodiment, decoding logic 708 could be configured to decode circulants in the first four columns in a modified H matrix having eight columns, while decoding logic 710 could be configured to decode circulants in a last four columns of the modified H matrix.

In one embodiment, the modified H matrix is created by exchanging or "swapping" the circulants in at least one column of the original H matrix with circulants in another column of the original H matrix, in order to best distribute non-zero circulants in each row. In order to determine which columns to swap, a "brute force" approach may be used, where each row is evaluated to determine if an equal number of non-zero circulants are processed by each of decoding logic 708 and decoding logic 710, and swapping some of the circulants in a row to achieve as even distribution as possible. If a swap results in a better distribution of circulants in a particular row, all of the circulants in the columns containing the swapped circulants are also swapped. This process proceeds row-by-row, with a re-evaluation of the rows performed when any column of circulants are swapped with another column. The column arrangement that results in the fewest number of imbalances between decoding logic 708 and decoding logic 710 is selected as the modified H matrix. It should be understood that in some cases, only two columns of circulants are swapped with each other while in other embodiments, more than two columns of circulants are swapped with each other. Swapped columns may be adjacent to one another in the modified H matrix, or not. It should be further understood that modification of the original H matrix may be not be performed by digital data decoder 700 but, rather, by another computing device. In this case, the modified H matrix is merely stored in memory 724.

At block 804, input data transfer logic 702 receives the encoded datastream, using techniques well-known in the art.

In one embodiment, input data transfer logic 702 converts the datastream into a series of b-bit blocks of data, where b is an integer, for example, 128. Once each b-bit block is aligned ready, input data transfer logic 702 determines which of input buffer 704 and input buffer 706 each block should be stored, in an embodiment where two decoding logics are used. In general, when digital data decoder 700 comprises d decoding logics, d input buffers are used to store the blocks, and lookup table 126 is configured to assign the circulants in each column of the modified H matrix to one of the d input buffers, in accordance with any column swapping that may have occurred.

In one embodiment, a lookup table 726 is stored in memory 124 for use by input data transfer logic 702 to determine which input buffer to store the blocks. The lookup table is configured as an m×1 array, where m is equal to the number of columns in the modified H matrix. For example, if the number of columns in the modified H matrix is c, then m=c. Each of the elements of the lookup table are populated with "values", i.e., digital "1"s and "0"s in the case of two decoding logics and, in general, integers from 1–d, where d denotes the number of decoding logics. Each value is indicative of a particular buffer in which to store a block and the values are assigned to the elements in accordance with each of the columns of the modified H matrix, respectively. For an example, to populate lookup table 726 in the case of two decoding logics, the lookup table is populated with alternating digital values, such as "1"s and "0"s, where "1" indicates that a block should be stored in input buffer 104 while a "0" indicates that a block should be stored in input buffer 106. However, because the original H array has been modified by swapping circulants in one column with circulants in another column, the lookup table is modified to address this change. Thus, in the example of a modified H matrix comprising eight columns (i.e., columns 1-8), if columns two and three are swapped from the original H matrix and, normally, decoding logic 708 uses circulants in even columns while decoding logic 710 uses circulants in odd columns, the second and third elements in the lookup table are modified to reflect the change. In other words, the lookup table may first be filled with 1's and 0's:

1 0 1 0 1 0 1 0

However, due to columns two and three being swapped, the lookup table is modified as follows:

1 1 0 0 1 0 1 0

As one can see, decoding logic 708 will use circulants in the first, second, fifth and seventh columns in each row, while decoding logic 710 will use circulants in the third, fourth, sixth and eight rows.

At block 806, input data transfer logic 702 determines an address in one of the buffers that the b-bit block of encoded data will be stored. In one embodiment, input data transfer logic 702 utilizes one pointer corresponding to each input buffer, for example, one corresponding to input buffer 704 and one corresponding to input buffer 706, each pointer initially pointing to a first address in each of the respective input buffers. When a block is ready to be stored, input data transfer logic 702 first determines which input buffer to store the block, as described above, and then uses the address indicated by the pointer corresponding to the buffer where the block will be stored. After storing the block in the proper input buffer, input data transfer logic 702 increments the pointer by one, now pointing to a next sequential address in that buffer. Of course, in another embodiment, when a block is ready to be stored, one of the pointers can be incremented first, and then the block stored at that address. Thus, each pointer tracks entries into each input buffer, respectively, and stores blocks in addresses of each buffer sequentially.

At block 808, input data transfer logic 702 stores the block in one of the plurality of input buffers, as determined at block 804, in a memory location in one of the plurality of input buffers, in accordance with a pointer associated with the input buffer where the block is stored. Typically, a demultiplexer 703 is used to perform this function, as is well-known in the art.

At block 810, when at least one block has been stored in each of the input buffers, a decoding logic corresponding to each input buffer begin to decode the blocks in parallel. When the columns of the modified H matrix are arranged in an optimal ordering, each of the plurality of decoding logics operate on a respective block using a non-zero circulant, and, thus, the processing time to decode each of the blocks are approximately the same, thus avoiding stalls or imbalances among the decoding logics. Thus, the efficiency of digital data decoder 700 is maximized because, generally, one decoding logic cannot begin to process a next block when another decoding logic is still processing a current block. Thus, re-arranging the original H matrix by swapping columns results in all of the decoding logics using non-zero circulants to decode a set of blocks in parallel.

In an embodiment where decoding logic 708 processes blocks from input buffer 704 using circulants in even-numbered columns of the modified H matrix, decoding logic 708 begins decoding a block in input buffer 704 using the first circulant (i.e., sub-matrix) in the first row in the modified matrix H, while decoding logic 710 begins decoding the block in input buffer 706, using the second circulant in the first row. This process is repeated until all of the circulants in the first row of the modified H matrix have been utilized. Processing then continues using circulants in the second row of the modified H matrix and so on, until all of the circulants in the modified H matrix have been utilized by the decoding logics.

An iterative two-step decoding algorithm known as a message passing algorithm may be employed by each of the decoding logics, as described above in accordance with FIG. 5. In such an iterative decoding process, all or some of check nodes 505 may first update based on messages received from all or some of variable nodes 501. In a second step, all or some of variable nodes 501 may update based on messages received from all or some of check nodes 505. The process may be repeated until either the block has been decoded or until a threshold number of iterations or sub-iterations has been reached.

The messages used in message passing algorithm 506 may be log-likelihood-ratio (LLR) messages, also known as soft information. Iterative decoder 216 may calculate the LLR messages for use in iterative message-passing algorithm 506 to correct or detect errors in a received block. Prior to the first iteration of message passing algorithm 506, for example, each of the variable nodes 501 may receive an LLR message based on information from received vector 214 of FIG. 2.

At block 812, merge logic 712 computes the global minimum by comparing a LLR minimum for each of the plurality of input buffers, each computed from the LLRs of variable nodes in each buffer. Computation of the $2^{nd}$ minimum in a similar way, computing the global $2^{nd}$ minimum by comparing the the $2^{nd}$ LLR minimums for each of the plurality of input buffers.

At block 814, the decoded blocks from the plurality of decoding logics are stored sequentially into a plurality of respective output buffers. In the case of two decoding logics, decoded blocks are stored in output buffers 714 and 716.

At block 816, output data transfer logic 720 retrieves the decoded blocks from the output buffers in an order that the encoded blocks corresponding to the decoded blocks were stored into the plurality of input buffers.

In one embodiment, lookup table 726 is used by output data transfer logic 720 in order to determine the order in which decoded blocks should be retrieved from the output buffers. As described earlier, lookup table 726 comprises a plurality of elements, each element storing a value where each value determines in which input buffer to store each block. Output data transfer logic 720 retrieves blocks from each of the output buffers in accordance with lookup table 726.

For example, when using two decoding logics, if a block is stored in input buffer 704 when an element in lookup table 126 comprise a "1", and a block is stored in input buffer 706 when an element in lookup table 726 comprises a "0", and lookup table 126 comprises eight elements, as follows:

1 0 0 0 1 0 1 1

Then output data transfer logic 720 retrieves decoded blocks from output buffer 712 when pointing to a "1" in lookup table 726, and retrieves decoded blocks from output buffer 714 when pointing to a "0" in lookup table 726. Thus, a first eight blocks from the output buffers are retrieved as follows:

1. Output buffer 712
2. Output buffer 714
3. Output buffer 714
4. Output buffer 714
5. Output buffer 712
6. Output buffer 714
7. Output buffer 712
8. Output buffer 712

Output data transfer logic 720 arranges the blocks in the order that they are retrieved from the output buffers to re-construct the original data stream, using techniques well-known in the art. This concept can be extended to retrieve blocks from multiple output buffers when multiple decoding logics are used.

The methods or algorithms described in connection with the embodiments disclosed herein may be embodied directly in hardware or embodied in processor-readable instructions executed by a processor. The processor-readable instructions may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components.

Accordingly, an embodiment of the invention may comprise a computer-readable media embodying code or processor-readable instructions to implement the teachings, methods, processes, algorithms, steps and/or functions disclosed herein.

It is to be understood that the decoding apparatus and methods described herein may also be used in other communication situations and are not limited to RAID storage. For example, compact disk technology also uses erasure and error-correcting codes to handle the problem of scratched disks and would benefit from the use of the techniques described herein. As another example, satellite systems may use erasure codes in order to trade off power requirements for transmission, purposefully allowing for more errors by reducing power and chain reaction coding would be useful in that application. Also, erasure codes may be used in wired and wireless communication networks, such as mobile telephone/data networks, local-area networks, or the Internet. Embodiments of the current invention may, therefore, prove useful in other applications such as the above examples, where codes are used to handle the problems of potentially lossy or erroneous data.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

We claim:

1. A method for efficiently decoding an encoded datastream using a modified LDPC H matrix, the modified LDPC H matrix derived from an original LDPC H matrix normally used to decode the encoded datastream, the method comprising:

storing the modified LDPC H matrix in a memory, the modified LDPC H matrix comprising the original LDPC H matrix with circulants in a first column of the original LDPC H matrix swapped with circulants in a second column of the original LDPC H matrix;

assigning circulants in each column of the modified LDPC H matrix to one of a plurality of decoding logics for processing in accordance with a predetermined assignment scheme, wherein the predetermined assignment scheme is modified based on any column of circulants that was swapped with another column of circulants;

receiving the encoded datastream by input data transfer logic;

generating encoded blocks from the encoded datastream by the input data transfer logic;

determining, by the input data transfer logic, one of a plurality of buffers in which to store each block;

storing, by the input data transfer logic, the blocks into the plurality of buffers in accordance with a determination for each block; and     decoding the blocks stored in the plurality of buffers by the plurality of decoding logics, one block from each of the plurality of buffers at a time.

2. The method of claim 1, wherein the original LDPC H matrix comprises a generator matrix G of the dual code, $C^\perp$ used to encode the datastream.

3. The method of claim 1, wherein the predetermined assignment scheme comprises assigning each of the plurality of decoding logics to one or more columns of circulants of the modified LDPC H matrix in a predefined order.

4. The method of claim 1, further comprising:

wherein the modified LDPC H matrix causes an even distribution of non-zero circulants in the modified H matrix such that the plurality of decoding logics process the non-zero circulants in parallel with each other.

5. The method of claim 1, wherein swapping the first column of circulants with the second column of circulants comprises:

swapping a first circulant in a first row of the original LDPC H matrix with a second circulant in the first row of the original LDPC H matrix such that the number of non-zero circulants in a row of the modified LDPC H matrix are processed evenly among the plurality of decoding logics; and swapping the circulants in the first column of the original LDPC H matrix that contained the first circulant with circulants in the second column of the original LDPC H matrix that contained the second circulant.

6. The method of claim 1, wherein determining one of a plurality of buffers in which to store each block comprises:
determining, by a processor, digital values from a lookup table, the lookup table comprising a plurality of elements, each of the elements for storing one of the digital values, wherein each of the digital values indicates a particular one of the plurality of buffers that a block should be stored.

7. The method of claim 1, wherein determining one of a plurality of buffers in which to store each block comprises:
storing a lookup table comprising a plurality of elements, each element corresponding to one of a plurality of circulants in a first row of the modified LDPC H matrix, respectively;
assigning, by a processor, a first digital value to each even element in the lookup table, the first digital value indicating that a block should be stored in the first buffer, when a corresponding even column of the modified LDPC H matrix has not been swapped;
assigning, by the processor, a second digital value to each odd element in the lookup table, the second digital value indicating that a block should be stored in the second buffer, when a corresponding odd column of the modified LDPC H matrix has not been swapped;
assigning, by the processor, the second digital value to an even element if a circulant corresponding to the even element was swapped;
assigning, by the processor, the first digital value to an odd element if a circulant corresponding to the odd element was swapped;
storing, by the processor, a first block in the first buffer when a first element in the lookup table comprises the first digital value; and
storing, by the processor, a second block in the second buffer when a second element in the lookup table comprises the second digital value.

8. The method of claim 1, wherein decoding the blocks further comprises:
storing decoded blocks by each of the plurality of decoding logics in a respective one of a plurality of output buffers; and
retrieving, by data transfer output logic, decoded blocks from the plurality of output buffers in an order that the encoded blocks corresponding to the decoded blocks were stored in the plurality of buffers.

9. The method of claim 8, wherein determining one of a plurality of buffers in which to store each block comprises:
retrieving, by a processor, values from a lookup table, wherein a first value indicates that a block should be stored in a first buffer of the plurality of buffers and the second value indicates that a block should be stored in a second buffer of the plurality of buffers; and
wherein retrieving decoded blocks from the plurality of output buffers in an order that the encoded blocks corresponding to the decoded blocks were stored in the plurality of buffers comprises retrieving decoded blocks from a first output buffer of the plurality of output buffers by the data transfer output logic when a first value is stored in a first element of the lookup table, and retrieving a second decoded block from a second output buffer of the plurality of output buffers by the data transfer output logic when a second value is stored in a second element of the lookup table.

10. The method of claim 6 wherein the number of elements in the lookup table is equal to a number of columns in the modified LDPC H matrix.

11. A digital data decoder for efficiently decoding an encoded data stream, comprising:
input data transfer logic for receiving the encoded datastream from a source, for generating encoded blocks from the encoded datastream and for storing each of the generated blocks into one of a plurality of buffers;
the plurality of buffers for storing the blocks;
a memory for storing a modified LDPC H matrix, the modified LDPC H matrix comprising an original LDPC H matrix, comprising a plurality circulants stored in a plurality of rows and columns, with circulants in a first column swapped with circulants in a second column; and
a plurality of decoding logics for decoding blocks stored in the plurality of buffers in parallel with the circulants stored in the memory.

12. The digital data decoder of claim 11, wherein the original LDPC H matrix comprises a generator matrix G of the dual code, $C^{\perp}$ used to encode the datastream.

13. The digital decoder of claim 11, wherein the first column is swapped with the second column by determining an arrangement of the columns of the original LDPC H matrix such that a number of non-zero circulants in the modified LDPC H matrix are evenly distributed for processing among the plurality of decoding logics.

14. The digital data decoder of claim 13, wherein determining the arrangement of the columns comprises:
swapping a first circulant in a first row of the original LDPC H matrix with a second circulant in the first row of the original LDPC H matrix such that the number of non-zero circulants in a row of the modified LDPC H matrix are arranged in pairs in the row in the modified LDPC H matrix; and
swapping the circulants in the first column that contained the first circulant with circulants in the second column that contained the second circulant.

15. The digital data decoder of claim 11, further comprising:
a lookup table stored in the memory, the lookup table comprising a plurality of elements, each element for storing one of a plurality of digital values, wherein each of the digital values indicates which of the plurality of buffers a block should be stored;
wherein storing the blocks by the data transfer input logic comprises:
determining, by the input data transfer logic, a first digital value from a first element of the lookup table and storing a first block in a first of the plurality of buffers indicated by the first digital value; and
determining, by the input data transfer logic, a second digital value from a second element of the lookup table and storing a second block in a second of the plurality of buffers indicated by the second digital value.

16. The digital data decoder of claim 11, further comprising:

a lookup table comprising a plurality of elements, each element corresponding to each of the circulants in a first row of the modified LDPC H matrix, respectively;

wherein each even element in the lookup table is assigned a first digital value, the first digital value indicating that a block should be stored in the first buffer, when a corresponding even column of the modified LDPC H matrix has not been swapped;

wherein each odd element in the lookup table is assigned a second digital value, the second digital value indicating that a block should be stored in the second buffer, when a corresponding odd column of the modified LDPC H matrix has not been swapped;

wherein the second digital value is assigned to an even element of the lookup table when an even column of the modified LDPC H matrix was swapped;

wherein the first digital value is assigned to an odd element of the lookup table when an odd column of the modified LDPC H matrix was swapped; and the input data transfer logic determines whether to store each block in either the first buffer or the second buffer by storing a first block in the first buffer when a first element in the lookup table comprises the first digital value, and storing a second block in the second buffer when a second element in the lookup table comprises the second digital value.

17. The digital data decoder of claim 11, further comprising:

a plurality of output buffers for storing decoded blocks from the plurality of decoding logics, respectively; and data output transfer logic for producing a decoded data stream by retrieving decoded blocks from the plurality of output buffers in an order that the encoded blocks corresponding to the decoded blocks were stored in the plurality of buffers.

18. The digital data decoder of claim 17, further comprising:

a lookup table, the lookup table comprising a plurality elements, each of the elements for storing digital values, wherein each of the digital values indicates which of the plurality of buffers a block should be stored;

wherein retrieving decoded blocks from plurality of decoding logics comprises:

determining the digital values stored in each of the elements of the lookup table; and retrieving the decoded blocks from the plurality of output buffers in an order as determined by the digital values.

19. The digital data decoder of claim 11, wherein the number of elements in the lookup table is equal to a number of columns in the modified LDPC H matrix.

* * * * *